US012614579B2

(12) United States Patent
Kim et al.

(10) Patent No.: US 12,614,579 B2
(45) Date of Patent: Apr. 28, 2026

(54) SEMICONDUCTOR SYSTEM FOR PERFORMING READ-MODIFY-WRITE OPERATION

(71) Applicant: SK hynix Inc., Icheon-si (KR)

(72) Inventors: Woongrae Kim, Icheon-si (KR); Seol Min Yi, Icheon-si (KR); Kyoung Chul Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 212 days.

(21) Appl. No.: 18/488,269

(22) Filed: Oct. 17, 2023

(65) Prior Publication Data

US 2024/0420752 A1 Dec. 19, 2024

(30) Foreign Application Priority Data

Jun. 19, 2023 (KR) ......................... 10-2023-0078542

(51) Int. Cl.
| | |
|---|---|
| *G11C 11/40* | (2006.01) |
| *G11C 11/406* | (2006.01) |
| *G11C 29/12* | (2006.01) |
| *G11C 29/46* | (2006.01) |

(52) U.S. Cl.
CPC .. *G11C 11/40615* (2013.01); *G11C 11/40622* (2013.01); *G11C 29/12015* (2013.01); *G11C 29/46* (2013.01)

(58) Field of Classification Search
CPC ........ G11C 11/40615; G11C 11/40622; G11C 29/12015; G11C 29/46
See application file for complete search history.

(56) References Cited

U.S. PATENT DOCUMENTS

| | | | |
|---|---|---|---|
| 8,159,885 B2 * | 4/2012 | Lee ......................... | G11C 5/00 365/222 |
| 10,311,951 B2 | 6/2019 | Bedeschi et al. | |
| 11,276,451 B2 * | 3/2022 | Song ..................... | G11C 11/406 |
| 11,475,929 B2 * | 10/2022 | Noguchi .............. | G11C 7/1096 |

FOREIGN PATENT DOCUMENTS

KR 1020210039047 A 4/2021

* cited by examiner

*Primary Examiner* — Vanthu T Nguyen
(74) *Attorney, Agent, or Firm* — WILLIAM PARK AND ASSOCIATES LTD.

(57) ABSTRACT

A semiconductor system includes a controller outputting a clock, a chip selection signal, a command address, and data, and a semiconductor device performing an auto-refresh operation when the chip selection signal and command address input in synchronization with the clock have a combination for performing the auto-refresh operation, correcting an error of internal data stored therein by performing a read-modify-write operation instead of the auto-refresh operation when the auto-refresh operation is performed a first set number of times and storing the corrected internal data, performing a self-refresh operation when the chip selection signal and command address input in synchronization with the clock have a combination for performing the self-refresh operation, and correcting an error of the internal data stored therein by performing a read-modify-write operation instead of the self-refresh operation when the self-refresh operation is performed a second set number of times and to store the corrected internal data.

10 Claims, 14 Drawing Sheets

211  BUF CT

212  CMD DEC

CS

CA<1:L>

CLK

ICSR

ICAR<1:L>

AREF

SREF

ACT

231 TEMP SENSOR

232 SELF REF PUL GEN

233 AUTO REF PUL GEN

234 IREF GEN

SREF

TINF

SRP

ARP

REN

AREF

SREF

IREF

ACT RMW
GEN

AREF
ATM
SREF
STM

ACT_RMW

242

R/W
CTR

RD_RMW
WT_RMW
PCG_RMW
CADD
<1:N>

243

PG RMW
GEN

SREF
PCG_RMW

PG_RMW

FIG. 7

SEMICONDUCTOR SYSTEM FOR PERFORMING READ-MODIFY-WRITE OPERATION

CROSS-REFERENCE TO RELATED APPLICATION

The present application claims priority under 35 U.S.C. § 119(a) to Korean Patent Application No. 10-2023-0078542, filed in the Korean Intellectual Property Office on Jun. 19, 2023, the entire disclosure of which is incorporated herein by reference.

BACKGROUND

The present disclosure relates to a semiconductor system for correcting an error of internal data by performing a read-modify-write operation when each of an auto-refresh operation and a self-refresh operation is performed a set number of times.

Recently, in order to increase the operating speed of a semiconductor device, a method of inputting and outputting multi-bit data every clock cycle, such as DDR2, DDR3, DDR4, or DDR5, has been used. If the input/output speed of data reaches a certain speed, a separate device and method for guaranteeing the reliability of data transmission are additionally required because the probability that an error occurring during a process of transmitting data occurs also increases.

A method of guaranteeing the reliability of data transmission by generating an error check code capable of checking whether an error occurs whenever data are transmitted and transmitting the error check code along with the data is being used. The error check code includes an error detection code (EDC) capable of detecting whether an error has occurred and an error correction code (ECC) capable of autonomously correcting an error when the error occurs.

SUMMARY

In an embodiment, a semiconductor system may include a controller configured to output a clock, a chip selection signal, and a command address and configured to output data and a semiconductor device configured to perform an auto-refresh operation when the chip selection signal and the command address that are input in synchronization with the clock have a combination for performing the auto-refresh operation, configured to correct an error of internal data that are stored within the semiconductor device by performing a read-modify-write operation instead of the auto-refresh operation when the auto-refresh operation is performed a first set number of times and to store the corrected internal data, configured to perform a self-refresh operation when the chip selection signal and the command address that are input in synchronization with the clock have a combination for performing the self-refresh operation, and configured to correct an error of the internal data that are stored within the semiconductor device by performing a read-modify-write operation instead of the self-refresh operation when the self-refresh operation is performed a second set number of times and to store the corrected internal data.

In an embodiment, a semiconductor device may include a read-modify-write control circuit configured to generate a power control signal when a self-refresh operation is performed a set number of times and configured to sequentially generate an internal read signal and an internal write signal, a power supply circuit configured to supply a power supply voltage to a column control circuit during an interval in which the power control signal is enabled, and the column control circuit configured to operate by being supplied with the power supply voltage, configured to generate read data and a read parity by receiving internal data and an internal parity when the internal read signal is input, and configured to output the read data as the internal data by correcting an error of the read data based on the read parity and the write parity when the internal write signal is input.

BRIEF DESCRIPTION OF THE DRAWINGS

FIG. 3 is a block diagram illustrating a construction according to an embodiment of a command generation circuit that is included in the semiconductor device illustrated in FIG. 2.

FIG. 5 is a block diagram illustrating a construction according to an embodiment of a refresh control circuit that is included in the semiconductor device illustrated in FIG. 2.

FIG. 6 is a block diagram illustrating a construction according to an embodiment of a read-modify-write control circuit that is included in the semiconductor device illustrated in FIG. 2.

FIG. 7 is a diagram illustrating a construction according to an embodiment of an internal active signal generation circuit that is included in the read-modify-write control circuit illustrated in FIG. 6.

DETAILED DESCRIPTION

Figure 1:
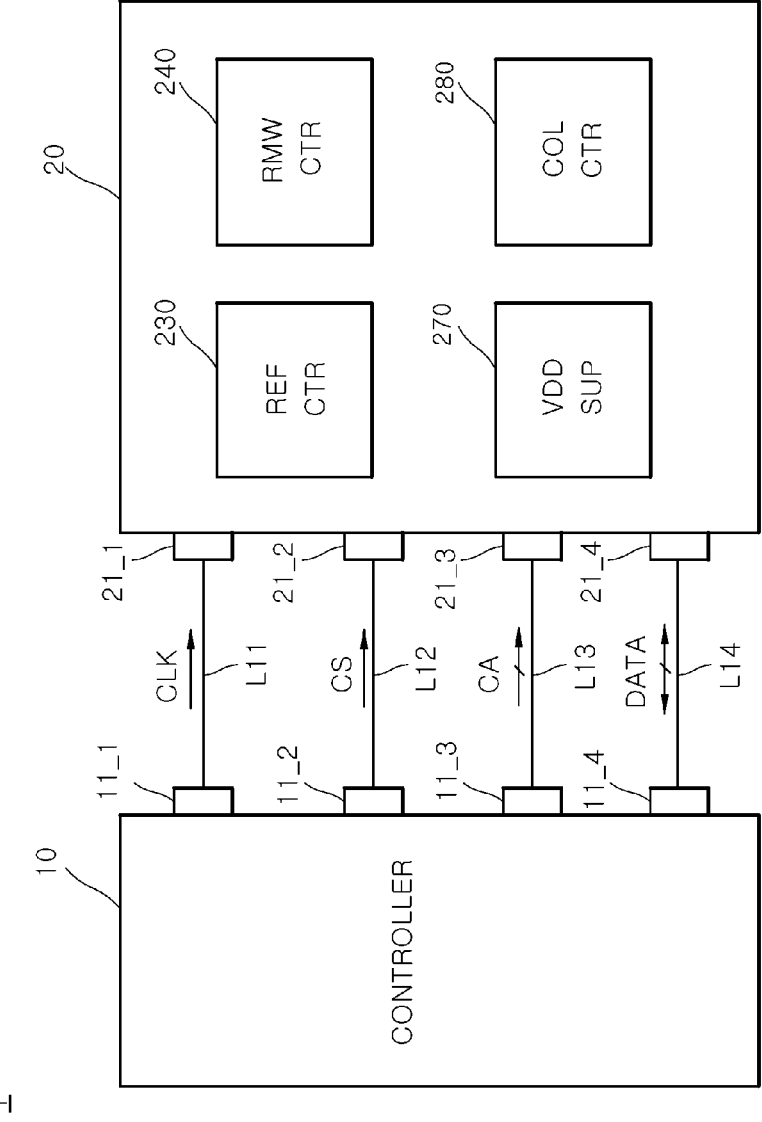
FIG. 1 is a block diagram illustrating a construction of a semiconductor system according to an embodiment of the present disclosure.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through embodiments. The embodiments are only used to exemplify the present disclosure, and the scope of the present disclosure is not limited by the embodiments.

Embodiments of the present disclosure provide a semiconductor system for correcting an error of internal data by performing a read-modify-write operation when each of an auto-refresh operation and a self-refresh operation is performed a set number of times.

According to embodiments of the present disclosure, it is possible to perform an efficient operation without the need to add a command for performing a read-modify-write operation because an error of internal data is corrected by performing the read-modify-write operation when each of an auto-refresh operation and a self-refresh operation is performed a set number of times.

Furthermore, according to embodiments of the present disclosure, it is possible to prevent an error of internal data because an error of the internal data is corrected by performing a read-modify-write operation when each of an auto-refresh operation and a self-refresh operation is performed a set number of times.

Furthermore, according to embodiments of the present disclosure, it is possible to reduce power consumption by supplying a power supply voltage to the column control circuit only during an interval in which a read-modify-write operation is performed when each of an auto-refresh operation and a self-refresh operation is performed a set number of times.

As illustrated in FIG. 1, a semiconductor system 1 may include a controller 10 and a semiconductor device 20. The semiconductor device 20 may include a refresh control circuit (REF CTR) 230, a read-modify-write control circuit (RMW CTR) 240, a power supply circuit (VDD SUP) 270, and a column control circuit (COL CTR) 280.

The controller 10 may include a first control pin 11_1, a second control pin 11_2, a third control pin 11_3, and a fourth control pin 11_4. The semiconductor device 20 may include a first device pin 21_1, a second device pin 21_2, a third device pin 21_3, and a fourth device pin 21_4. A first transmission line L11 may be connected between the first control pin 11_1 and the first device pin 21_1. A second transmission line L12 may be connected between the second control pin 11_2 and the second device pin 21_2. A third transmission line L13 may be connected between the third control pin 11_3 and the third device pin 21_3. A fourth transmission line L14 may be connected between the fourth control pin 11_4 and the fourth device pin 21_4.

The controller 10 may transmit a clock CLK for controlling the semiconductor device 20 to the semiconductor device 20 through the first transmission line L11. The controller 10 may transmit a chip selection signal CS for controlling the semiconductor device 20 to the semiconductor device 20 through the second transmission line L12. The controller 10 may transmit a command address CA for controlling the semiconductor device 20 to the semiconductor device 20 through the third transmission line L13. The controller 10 may transmit data DATA to the semiconductor device 20 through the fourth transmission line L14. The controller 10 may receive data DATA from the semiconductor device 20 through the fourth transmission line L14. The clock CLK may be set as a signal that is periodically toggled in order to synchronize operations of the controller 10 and the semiconductor device 20. The chip selection signal CS may be set as a signal for activating the semiconductor device 20. The command address CA may include multiple bits and may be set as a signal including a command and an address for controlling an operation of the semiconductor device 20. The data DATA may be set as data including multiple bits.

The controller 10 may output the chip selection signal CS and the command address CA to the semiconductor device 20, in synchronization with the clock CLK, for performing an auto-refresh operation and a self-refresh operation.

When an auto-refresh command (AREF in FIG. 2) is input after the start of an auto-refresh operation, the refresh control circuit 230 may generate an internal refresh signal (IREF in FIG. 2) including a pulse that is generated. When the auto-refresh command (AREF in FIG. 2) is input after the start of a smart refresh operation, the refresh control circuit 230 may block the generation of the internal refresh signal (IREF in FIG. 2). When a self-refresh command (SREF in FIG. 2) is input after the start of a self-refresh operation, the refresh control circuit 230 may generate the internal refresh signal (IREF in FIG. 2) including a pulse that is periodically generated.

The read-modify-write control circuit 240 may generate a power control signal (PG_RMW in FIG. 2) when an auto-refresh operation is performed a first set number of times. When an auto-refresh operation is performed the first set number of times, the read-modify-write control circuit 240 may sequentially generate an internal read signal (RD_RMW in FIG. 2) and an internal write signal (WT_RMW in FIG. 2) for performing a read-modify-write operation. The read-modify-write control circuit 240 may generate the power control signal (PG_RMW in FIG. 2) when a self-refresh operation is performed a second set number of times. When a self-refresh operation is performed the second set number of times, the read-modify-write control circuit 240 may sequentially generate the internal read signal (RD_RMW in FIG. 2) and the internal write signal (WT_RMW in FIG. 2) for performing a read-modify-write operation.

The power supply circuit 270 may supply a power supply voltage (VDD in FIG. 2) to the column control circuit 280 during an interval in which the power control signal (PG_RMW in FIG. 2) is enabled. The power supply circuit 270 may block the supply of the power supply voltage (VDD in FIG. 2) after the end of a read-modify-write operation.

Figure 2:
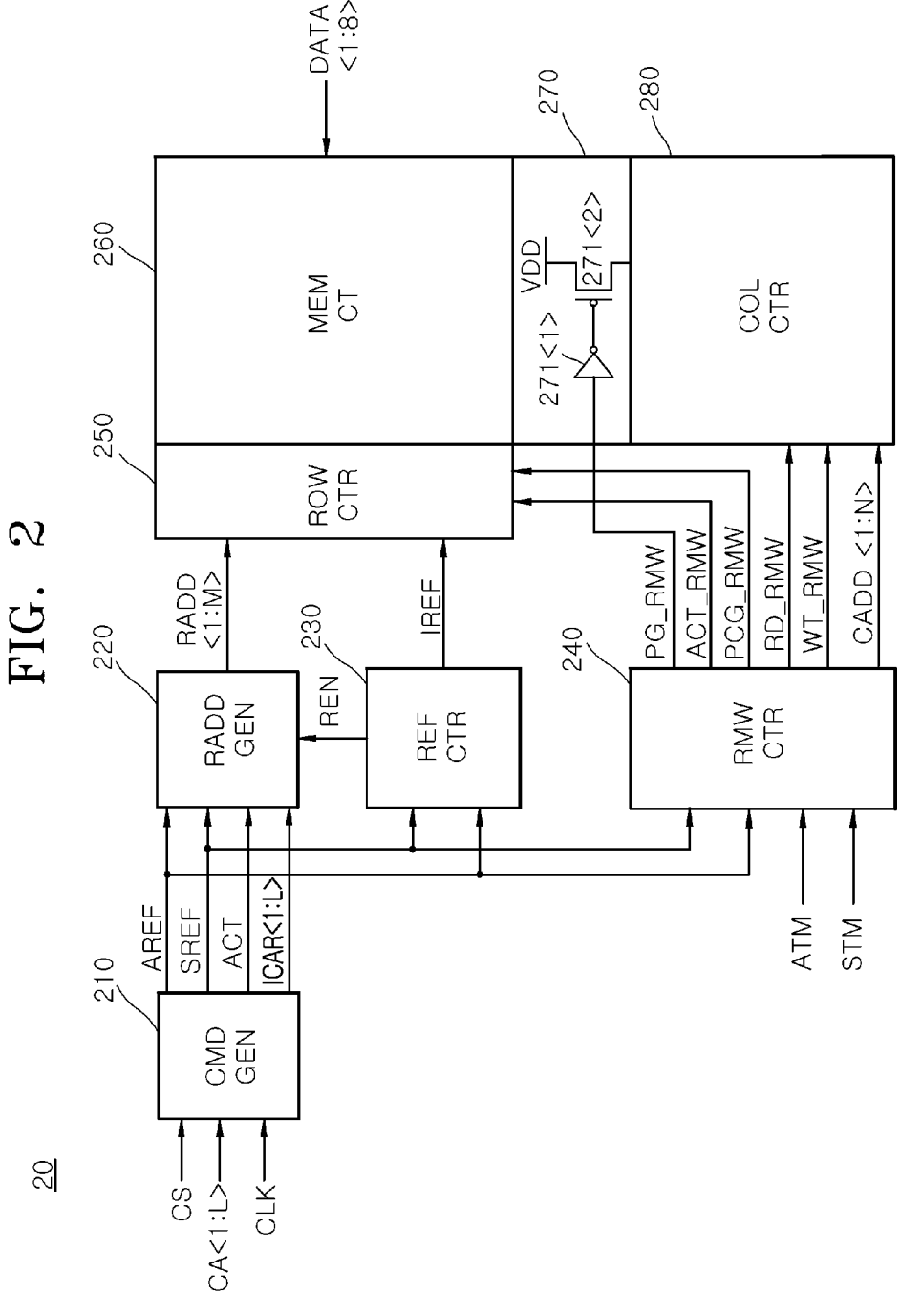
FIG. 2 is a block diagram illustrating a construction according to an embodiment of a semiconductor device that is included in the semiconductor system illustrated in FIG. 1.

The column control circuit 280 may operate by being supplied with the power supply voltage (VDD in FIG. 2). When the internal read signal (RD_RMW in FIG. 2) is input, the column control circuit 280 may receive internal data (ID<1:8> in FIG. 11) and the internal parities (IP<1:3> in FIG. 11). The column control circuit 280 may generate read data (RD<1:8> in FIG. 11) and read parities (RP<1:3> in FIG. 11) from the internal data (ID<1:8> in FIG. 11) and the internal parities (IP<1:3> in FIG. 11). When the internal write signal (WT_RMW in FIG. 2) is input, the column control circuit 280 may output the read data (RD<1:8> in FIG. 11) as the internal data (ID<1:8> in FIG. 11) by correcting an error of the read data (RD<1:8> in FIG. 11) based on the read parities (RP<1:3> in FIG. 11) and write parities (WP<1:3> in FIG. 11) that are generated from the read data (RD<1:8> in FIG. 11).

The semiconductor device 20 may perform an auto-refresh operation when the chip selection signal CS and the command address CA that are input in synchronization with the clock CLK have a combination for performing the auto-refresh operation. The semiconductor device 20 may perform a self-refresh operation when the chip selection signal CS and the command address CA that are input in synchronization with the clock CLK have a combination for performing the self-refresh operation. By performing a read-modify-write operation instead of an auto-refresh operation when the auto-refresh operation has been performed the first set number of times, the semiconductor device 20 may correct an error of the internal data (ID<1:8> in FIG. 11) that have been stored within the semiconductor device 20 and may store the internal data (ID<1:8> in FIG. 11) having the corrected error. By performing a read-modify-write operation instead of a self-refresh operation when the self-refresh operation has been performed the second set number of times, the semiconductor device 20 may correct an error of the internal data (ID<1:8> in FIG. 11) that have been stored within the semiconductor device 20 and may store the internal data (ID<1:8> in FIG. 11) having the corrected error. When each of an auto-refresh operation and a self-refresh operation is performed a set number of times, the semiconductor device 20 may supply the power supply voltage (VDD in FIG. 2) to the column control circuit 280 only during an interval in which a read-modify-write operation is performed. After the start of a read-modify-write operation, the semiconductor device 20 may store the read data (RD<1:8> in FIG. 11) by correcting an error of the read data (RD<1:8> in FIG. 11) based on the read parities (RP<1:3> in FIG. 11) and the write parities (WP<1:3> in FIG. 11) that are generated based on the read data (RD<1:8> in FIG. 11).

As illustrated in FIG. 2, the semiconductor device 20 may include a command generation circuit (CMD GEN) 210, a row address generation circuit (RADD GEN) 220, the refresh control circuit (REF CTR) 230, the read-modify-write control circuit (RMW CTR) 240, a row control circuit (ROW CTR) 250, a memory circuit (MEM CT) 260, the power supply circuit 270, and the column control circuit (COL CTR) 280.

The command generation circuit 210 may generate the auto-refresh command AREF, the self-refresh command SREF, an active command ACT, and first to L-th internal command addresses ICAR<1:L> based on the chip selection signal CS and first to L-th command addresses CA<1:L> that are input in synchronization with the clock CLK. The command generation circuit 210 may generate the auto-refresh command AREF when the chip selection signal CS and the first to L-th command addresses CA<1:L> that are input in synchronization with the clock CLK have a combination for performing an auto-refresh operation. The command generation circuit 210 may generate the self-refresh command SREF when the chip selection signal CS and the first to L-th command addresses CA<1:L> that are input in synchronization with the clock CLK have a combination for performing a self-refresh operation. The command generation circuit 210 may generate the active command ACT when the chip selection signal CS and the first to L-th command addresses CA<1:L> that are input in synchronization with the clock CLK have a combination for performing an active operation. The command generation circuit 210 may generate the first to L-th internal command addresses ICAR<1:L> based on the first to L-th command addresses CA<1:L> that are input in synchronization with a rising edge of the clock CLK.

When the active command ACT is input and a refresh enable signal REN is disabled, the row address generation circuit 220 may generate first to M-th row addresses RADD<1:M> for selecting word lines adjacent to a word line that is repeatedly activated by the first to L-th internal command addresses ICAR<1:L>. The row address generation circuit 220 may store the first to L-th internal command addresses ICAR<1:L> whenever the active command ACT is input and may generate first to M-th target addresses (SM_ADD<1:M> in FIG. 4) from the first to L-th internal command addresses ICAR<1:L> when the stored first to L-th internal command addresses ICAR<1:L> have the same logic level combination. The row address generation circuit 220 may generate the first to M-th row addresses RADD<1:M> from the first to M-th target addresses (SM_ADD<1:M> in FIG. 4) when a smart refresh operation of an auto-refresh operation is performed. The first to M-th target addresses (SM_ADD<1:M> in FIG. 4) may be set as addresses for activating word lines adjacent to a word line that is repeatedly activated. The first to M-th target addresses (SM_ADD<1:M> in FIG. 4) may be generated by latching the first to L-th internal command addresses ICAR<1:L> that are frequently input. The first to M-th target addresses (SM_ADD<1:M> in FIG. 4) may be counted whenever the first to L-th internal command addresses ICAR<1:L> are input and may be generated from the first to L-th internal command addresses ICAR<1:L> when the first to M-th target addresses (SM_ADD<1:M> in FIG. 4) having the same logic level combination are counted a lot (for example, more than 10 number of times). The row address generation circuit 220 may generate the first to M-th row addresses RADD<1:M> that are sequentially counted when the auto-refresh command AREF is input and the refresh enable signal REN is enabled. The row address generation circuit 220 may generate the first to M-th row addresses RADD<1:M> that are sequentially counted when the self-refresh command SREF is input and the refresh enable signal REN is enabled.

The refresh control circuit 230 may generate the internal refresh signal IREF including a pulse that is generated when the auto-refresh command AREF is input. The refresh control circuit 230 may block the generation of the internal refresh signal IREF when the auto-refresh command AREF is input after the start of a smart refresh operation. The refresh control circuit 230 may generate the internal refresh signal IREF including a pulse that is periodically generated when the self-refresh command AREF is input. When the logic level of data stored in a memory cell (MC in FIG. 10) transitions, the internal refresh signal IREF may be generated to include a pulse that is periodically generated within a period of time that is shorter than a retention time. When the auto-refresh command AREF is input and an auto-refresh operation is performed, the refresh control circuit 230 may generate the refresh enable signal REN that is enabled. When the auto-refresh command AREF is input and a smart refresh operation is performed, the refresh control circuit 230 may generate the refresh enable signal REN that is disabled. When the self-refresh command SREF is input and a self-refresh operation is performed, the refresh control circuit 230 may generate the refresh enable signal REN that is enabled.

The read-modify-write control circuit 240 may generate the power control signal PG_RMW when the auto-refresh command AREF and the self-refresh command SREF are input. When any one of the auto-refresh command AREF and the self-refresh command SREF is input, the read-modify-write control circuit 240 may generate the power control signal PG_RMW that is enabled.

The first set number may be set in the read-modify-write control circuit 240 in response to an auto-test mode signal ATM. The read-modify-write control circuit 240 may generate an internal active signal ACT_RMW when the auto-refresh command AREF is input the first set number of times. The read-modify-write control circuit 240 may generate the internal read signal RD_RMW, the internal write signal WT_RMW, and the internal precharge signal PCG_RMW that are sequentially enabled by delaying the internal active signal ACT_RMW. The first set number may vary according to embodiments. For example, when the first set number is set to five, the read-modify-write control circuit 240 may generate the internal active signal ACT_RMW when the auto-refresh command AREF is input five times.

The second set number may be set in the read-modify-write control circuit 240 in response to a self-test mode signal STM. The read-modify-write control circuit 240 may generate the internal active signal ACT_RMW when the self-refresh command SREF is input the second set number of times. The read-modify-write control circuit 240 may generate the internal read signal RD_RMW, the internal write signal WT_RMW, and the internal precharge signal PCG_RMW that are sequentially enabled by delaying the internal active signal ACT_RMW. The second set number may vary according to embodiments. For example, when the second set number is set to seven, the read-modify-write control circuit 240 may generate the internal active signal ACT_RMW when the self-refresh command SREF is input seven times.

When the internal active signal ACT_RMW and the internal refresh signal IREF are input, the row control circuit 250 may activate any one of multiple word lines (WL1 to WLj in FIG. 10) based on the first to M-th row addresses RADD<1:M>. A case in which any one of the word lines (WL1 to WLj in FIG. 10) is activated may be set as an operation of activating a word line in a common active operation, an auto-refresh operation, and a self-refresh operation. A case in which any one of the word lines (WL1 to WLj in FIG. 10) is activated may mean a case in which a word line that is selected based on the first to M-th row addresses RADD<1:M> is driven to a high voltage level. When the internal precharge signal PCG_RMW is input, the row control circuit 250 may precharge any one of the multiple word lines (WL1 to WLj in FIG. 10) based on the first to M-th row addresses RADD<1:M>. A case in which any one of the word lines (WL1 to WLj in FIG. 10) is precharged may mean a case in which a word line is driven to a precharge voltage level in a precharge operation after a common active operation. A case in which any one of the word lines (WL1 to WLj in FIG. 10) is precharged may mean a case in which a word line that is selected based on the first to M-th row addresses RADD<1:M> is driven to a precharge voltage level.

After the start of an auto-refresh operation, the multiple word lines (WL1 to WLj in FIG. 10) of the memory circuit 260 may be sequentially activated by the first to M-th row addresses RADD<1:M>. After the start of a smart refresh operation, the memory circuit 260 may activate word lines adjacent to a word line that is repeatedly activated by the first to M-th row addresses RADD<1:M> that are generated from the first to M-th target addresses SM_ADD<1:M>. For example, after the start of a smart refresh operation, the memory circuit 260 may activate a first word line (WL1 in FIG. 10) and a third word line (WL3 in FIG. 10) when the first to M-th row addresses RADD<1:M> have a logic level combination for activating a second word line (WL2 in FIG. 10). After the start of a self-refresh operation, the memory circuit 260 may sequentially activate the multiple word lines WL1 to WLj based on the first to M-th row addresses RADD<1:M>. After the start of a read-modify-write operation, the memory circuit 260 may output the internal data (ID<1:8> in FIG. 11) that have been stored in a memory cell MC that is connected to a word line that is activated, among the multiple word lines (WL1 to WLj in FIG. 10), and a column line that is activated, among multiple column lines (Yi1 to Yik in FIG. 10). The memory circuit 260 may output the internal parities (IP<1:3> in FIG. 11) including information with regard to an error of the internal data (ID<1:8> in FIG. 11). After the start of a read-modify-write operation, the memory circuit 260 may store the internal data (ID<1:8> in FIG. 11) having a corrected error in a memory cell MC that is connected to a word line that is activated, among the multiple word lines (WL1 to WLj in FIG. 10), and a column line that is activated, among the multiple column lines (Yi1 to Yik in FIG. 10). After the start of a write operation, the memory circuit 260 may store first to eighth data DATA<1:8> in a memory cell MC that is connected to a word line that is activated, among the multiple word lines (WL1 to WLj in FIG. 10), and a column line that is activated, among the multiple column lines (Yi1 to Yik in FIG. 10). After the start of a read operation, the memory circuit 260 may output first to eighth data DATA<1:8> that have been stored in a memory cell MC that is connected to a word line that is activated, among the multiple word lines (WL1 to WLj in FIG. 10), and a column line that is activated, among the multiple column lines (Yi1 to Yik in FIG. 10).

The power supply circuit 270 may include an inverter 271<1> and a switch 271<2>. The inverter 271<1> may invert and output the power control signal PG_RMW. The switch 271<2> may be implemented by using a PMOS transistor. The switch 271<2> may be turned on when the output signal of the inverter 271<1> has a logic low level and may supply the power supply voltage VDD to the column control circuit 280. The power supply circuit 270 may supply the power supply voltage VDD to the column control circuit 280 during an interval in which the power control signal PG_RMW is enabled to a logic high level.

After the end of a read-modify-write operation, the power supply circuit 270 may block the supply of the power supply voltage VDD during an interval in which the power control signal PG_RMW is disabled to a logic low level.

The column control circuit 280 may operate by being supplied with the power supply voltage VDD. When the internal read signal RD_RMW is input, the column control circuit 280 may receive the internal data (ID<1:8> in FIG. 11) and the internal parities (IP<1:3> in FIG. 11) from the memory circuit 260. When the internal read signal RD_RMW is input, the column control circuit 280 may generate the read data (RD<1:8> in FIG. 11) and the read parities (RP<1:3> in FIG. 11) from the internal data (ID<1: 8> in FIG. 11) and the internal parities (IP<1:3> in FIG. 11). When the internal write signal WT_RMW is input, the column control circuit 280 may generate the internal data (ID<1:8> in FIG. 11) by correcting an error of the read data (RD<1:8> in FIG. 11) based on the write parities (WP<1:3> in FIG. 11) and the read parities (RP<1:3> in FIG. 11) that are generated from read data (RD<1:8> in FIG. 11). The column control circuit 280 may output the internal data (ID<1:8> in FIG. 11) having the corrected error to the memory circuit 260.

The semiconductor device 20 may perform an auto-refresh operation when the chip selection signal CS and the first to L-th command addresses CA<1:L> that are input in synchronization with the clock CLK have a combination for performing the auto-refresh operation. The semiconductor device 20 may supply the power supply voltage VDD to the column control circuit 280 when an auto-refresh operation is performed the first set number of times. By performing a read-modify-write operation instead of an auto-refresh operation when the auto-refresh operation is performed the first set number of times, the semiconductor device 20 may correct an error of the internal data (ID<1:8> in FIG. 11) that have been stored within the semiconductor device 20 and may store the internal data (ID<1:8> in FIG. 11) having the corrected error. The semiconductor device 20 may perform a self-refresh operation when the chip selection signal CS and the first to L-th command addresses CA<1:L> that are input in synchronization with the clock CLK have a combination for performing the self-refresh operation. The semiconductor device 20 may supply the power supply voltage VDD to the column control circuit 280 when a self-refresh operation is performed the second set number of times. By performing a read-modify-write operation instead of a self-refresh operation when the self-refresh operation is performed the second set number of times, the semiconductor device 20 may correct an error of the internal data (ID<1:8> in FIG. 11) that have been stored within the semiconductor device 20 and may store the internal data (ID<1:8> in FIG. 11) having the corrected error. By performing a smart refresh operation of an auto-refresh operation, the semiconductor device 20 may activate word lines adjacent to a word line that corresponds to a target address for selecting the word line and that is repeatedly activated.

Figure 3:
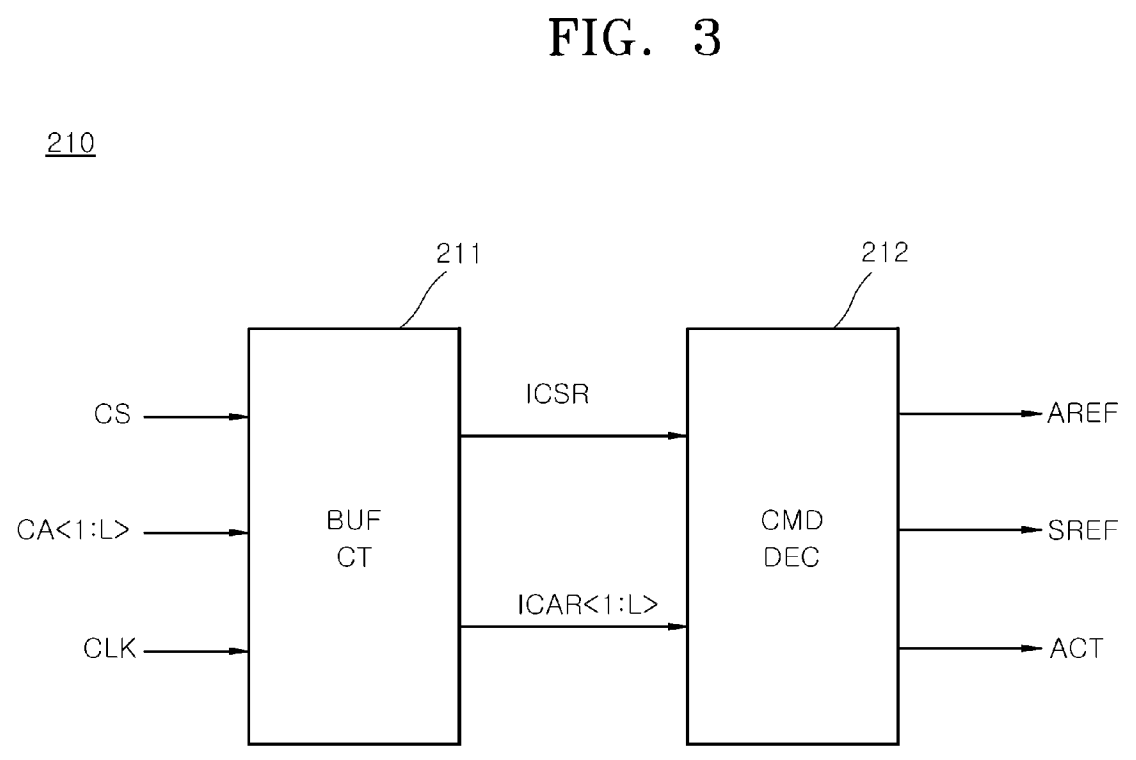

FIG. 3 is a block diagram illustrating a construction according to an embodiment of the command generation circuit 210 that is included in the semiconductor device 20. The command generation circuit 210 may include a buffer circuit (BUF CT) 211 and a command decoder (CMD DEC) 212.

The buffer circuit 211 may generate an internal chip selection signal ICSR by latching the chip selection signal CS in synchronization with a rising edge of the clock CLK. The buffer circuit 211 may generate first to L-th internal command addresses ICAR<1:L> by latching the first to L-th command addresses CA<1:L> in synchronization with a rising edge of the clock CLK.

The command decoder 212 may generate the auto-refresh command AREF, the self-refresh command SREF, and the active command ACT by decoding the internal chip selection signal ICSR and the first to L-th internal command addresses ICAR<1:L>. When the internal chip selection signal ICSR and the first to L-th internal command addresses ICAR<1:L> have a combination for performing an auto-refresh operation, the command decoder 212 may generate the auto-refresh command AREF that is enabled. When the internal chip selection signal ICSR and the first to L-th internal command addresses ICAR<1:L> have a combination for performing a self-refresh operation, the command decoder 212 may generate the self-refresh command SREF that is enabled. When the internal chip selection signal ICSR and the first to L-th internal command addresses ICAR<1: L> have a combination for performing an active operation, the command decoder 212 may generate the active command ACT that is enabled.

Figure 4:
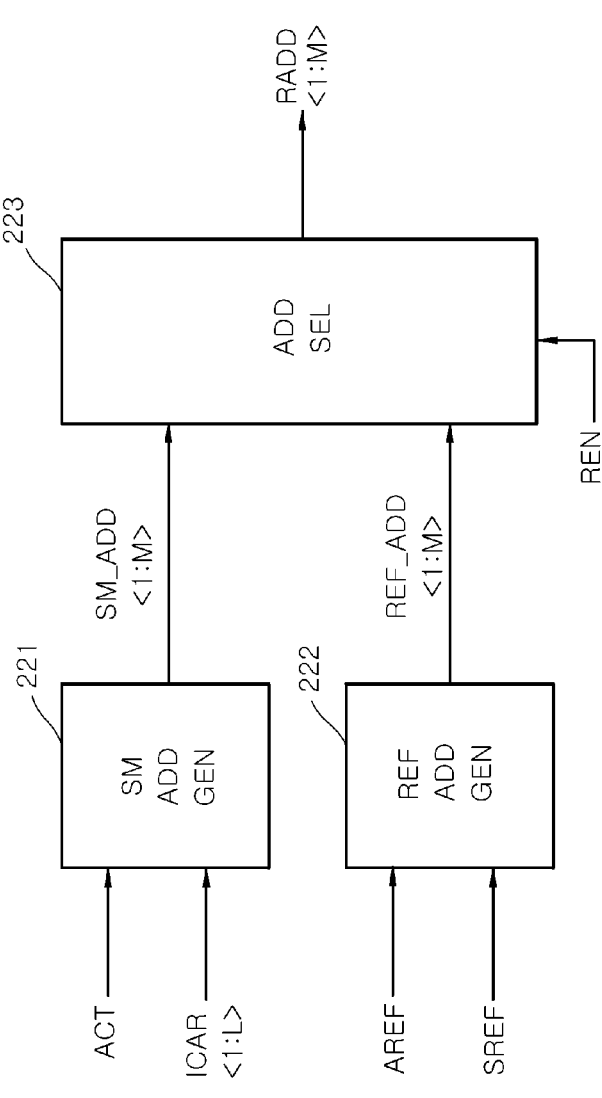
FIG. 4 is a block diagram illustrating a construction according to an embodiment of a row address generation circuit that is included in the semiconductor device illustrated in FIG. 2.

FIG. 4 is a block diagram illustrating a construction according to an embodiment of the row address generation circuit 220 that is included in the semiconductor device 20. The row address generation circuit 220 may include a target address generation circuit (SM ADD GEN) 221, a refresh address generation circuit (REF ADD GEN) 222, and an address selection circuit (ADD SEL) 223.

The target address generation circuit 221 may latch the first to L-th internal command addresses ICAR<1:L> whenever the active command ACT is input. When the latched first to L-th internal command addresses ICAR<1:L> have a logic level combination that is frequently input, the target address generation circuit 221 may generate the first to M-th target addresses SM_ADD<1:M> from the first to L-th internal command addresses ICAR<1:L>. The target address generation circuit 221 may count the first to L-th internal command addresses ICAR<1:L> whenever the first to L-th internal command addresses ICAR<1:L> are input and may generate the first M-th target addresses SM_ADD<1:M> from the first to L-th internal command addresses ICAR<1: L> when the first to L-th internal command addresses ICAR<1:L> having the same logic level combination are counted a lot (for example, more than 10 number of times). The first to M-th target addresses SM_ADD<1:M> may be set as addresses for activating a word line that is repeatedly activated. The first to M-th target addresses (SM_ADD<1: M> in FIG. 4) may be generated by latching the first to L-th internal command addresses ICAR<1:L> that are frequently input. The target address generation circuit 221 may count the first to L-th internal command addresses ICAR<1:L> whenever the first to L-th internal command addresses ICAR<1:L> are input and may generate the first to M-th target addresses (SM_ADD<1:M> in FIG. 4) from the first to L-th internal command addresses ICAR<1:L> when the first to L-th internal command addresses ICAR<1:L> having the same logic level combination are counted a lot (for example, more than 10 number of times).

The refresh address generation circuit 222 may generate first to M-th refresh addresses REF_ADD<1:M> that are sequentially counted when the auto-refresh command AREF is input. The refresh address generation circuit 222 may generate the first to M-th refresh addresses REF_ADD<1: M> that are sequentially counted when the self-refresh command SREF is input.

When the refresh enable signal REN is disabled, the address selection circuit 223 may generate the first to M-th row addresses RADD<1:M> from the first to M-th target addresses SM_ADD<1:M>. When the refresh enable signal REN is enabled, the address selection circuit 223 may generate the first to M-th row addresses RADD<1:M> from the first to M-th refresh addresses REF_ADD<1:M>.

Figure 5:
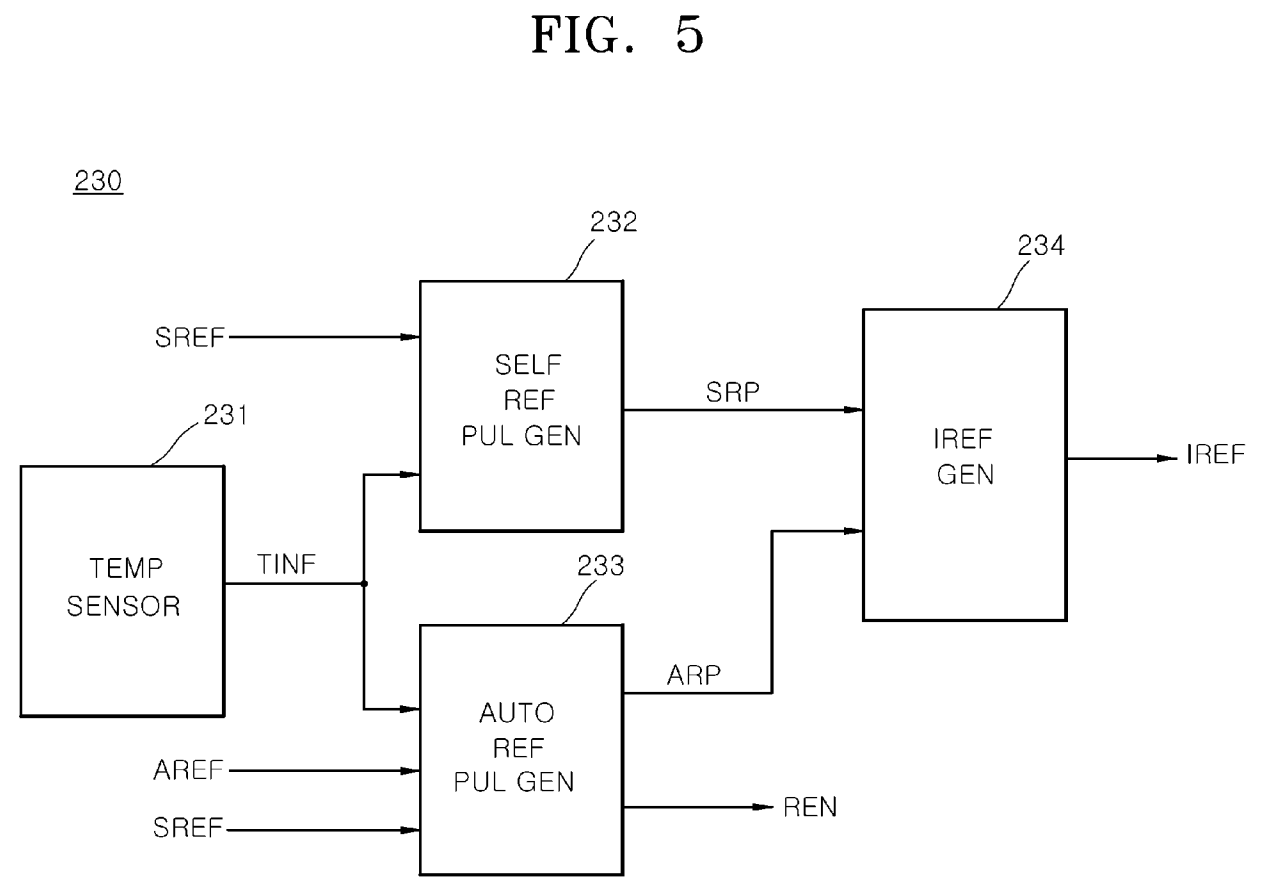

FIG. 5 is a block diagram illustrating a construction according to an embodiment of the refresh control circuit 230 that is included in the semiconductor device 20. The refresh control circuit 230 may include a temperature sensor (TEMP SENSOR) 231, a self-refresh pulse generation circuit (SELF REF PUL GEN) 232, an auto-refresh pulse generation circuit (AUTO REF PUL GEN) 233, and an internal refresh signal generation circuit (IREF GEN) 234.

The temperature sensor 231 may detect an internal temperature of the semiconductor device 20. The temperature sensor 231 may generate temperature information TINF including information with regard to an internal temperature of the semiconductor device 20. The temperature sensor 231 may generate the temperature information TINF including high temperature information and low temperature information of the semiconductor device 20.

When the self-refresh command SREF is input, the self-refresh pulse generation circuit 232 may generate a self-refresh pulse SRP, the generation cycle of which is adjusted based on the temperature information TINF. When the self-refresh command SREF is input and the temperature information TINF includes the high temperature information, the self-refresh pulse generation circuit 232 may generate the self-refresh pulse SRP, the generation cycle of which becomes relatively fast. When the self-refresh command SREF is input and the temperature information TINF includes the low temperature information, the self-refresh pulse generation circuit 232 may generate the self-refresh pulse SRP, the generation cycle of which becomes relatively slow.

When the auto-refresh command AREF is input, the auto-refresh pulse generation circuit 233 may generate an auto-refresh pulse ARP based on the temperature information TINF. When the auto-refresh command AREF is input, the auto-refresh pulse generation circuit 233 may block the generation of the auto-refresh pulse ARP if a smart refresh operation is performed based on the temperature information TINF. When the auto-refresh command AREF is input and an auto-refresh operation is performed, the auto-refresh pulse generation circuit 233 may generate the refresh enable signal REN that is enabled. When the auto-refresh command AREF is input and a smart refresh operation is performed, the auto-refresh pulse generation circuit 233 may generate the refresh enable signal REN that is disabled. A smart refresh operation may be performed during an auto-refresh operation. For example, a smart refresh operation may be performed once after an auto-refresh operation has been performed three times.

The internal refresh signal generation circuit 234 may generate the internal refresh signal IREF by synthesizing the self-refresh pulse SRP and the auto-refresh pulse ARP. The internal refresh signal generation circuit 234 may generate the internal refresh signal IREF from any one of the self-refresh pulse SRP and the auto-refresh pulse ARP. The internal refresh signal generation circuit 234 may generate the internal refresh signal IREF including a pulse that is generated when a pulse of the self-refresh pulse SRP and a pulse of the auto-refresh pulse ARP are generated.

Figure 6:
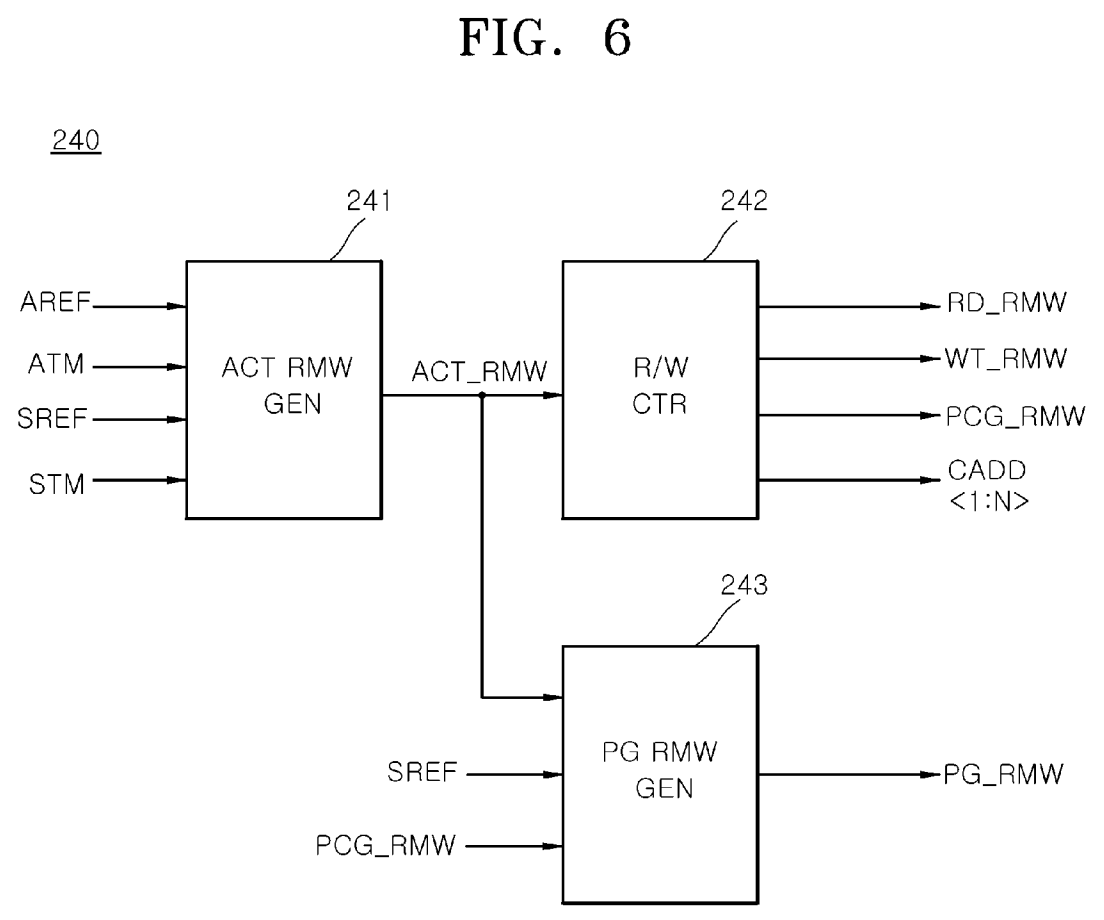

FIG. 6 is a block diagram illustrating a construction according to an embodiment of the read-modify-write control circuit 240 that is included in the semiconductor device 20. The read-modify-write control circuit 240 may include an internal active signal generation circuit (ACT RMW GEN) 241, a read/write control circuit (R/W CTR) 242, and a power control signal generation circuit (PG RMW GEN) 243.

The internal active signal generation circuit 241 may generate the internal active signal ACT_RMW based on the auto-refresh command AREF and the auto-test mode signal ATM. The internal active signal generation circuit 241 may set the first set number in response to the auto-test mode signal ATM. The internal active signal generation circuit 241 may generate the internal active signal ACT_RMW when the auto-refresh command AREF is input the first set number of times. For example, if the first set number is set to five, the internal active signal generation circuit 241 may generate the internal active signal ACT_RMW when the auto-refresh command AREF is input five times. The internal active signal generation circuit 241 may generate the internal active signal ACT_RMW based on the self-refresh command SREF and the self-test mode signal STM. The internal active signal generation circuit 241 may set the second set number in response to the self-test mode signal STM. The internal active signal generation circuit 241 may generate the internal active signal ACT_RMW when the self-refresh command SREF is input the second set number of times. For example, if the second set number is set to seven times, the internal active signal generation circuit 241 may generate the internal active signal ACT_RMW when the self-refresh command SREF is input seven times.

By delaying the internal active signal ACT_RMW, the read/write control circuit 242 may generate the internal read signal RD_RMW, the internal write signal WT_RMW, and the internal precharge signal PCG_RMW that are sequentially enabled. When the internal active signal ACT_RMW is input, the read/write control circuit 242 may generate first to N-th column addresses CADD<1:N> that are sequentially counted.

The power control signal generation circuit 243 may generate the power control signal PG_RMW based on the self-refresh command SREF, the internal active signal ACT_RMW, and the internal precharge signal PCG_RMW. When the internal active signal ACT_RMW is input during an interval in which the self-refresh command SREF is enabled, the power control signal generation circuit 243 may generate the power control signal PG_RMW that is enabled. When the internal precharge signal PCG_RMW is input, the power control signal generation circuit 243 may generate the power control signal PG_RMW that is disabled.

Figure 7:
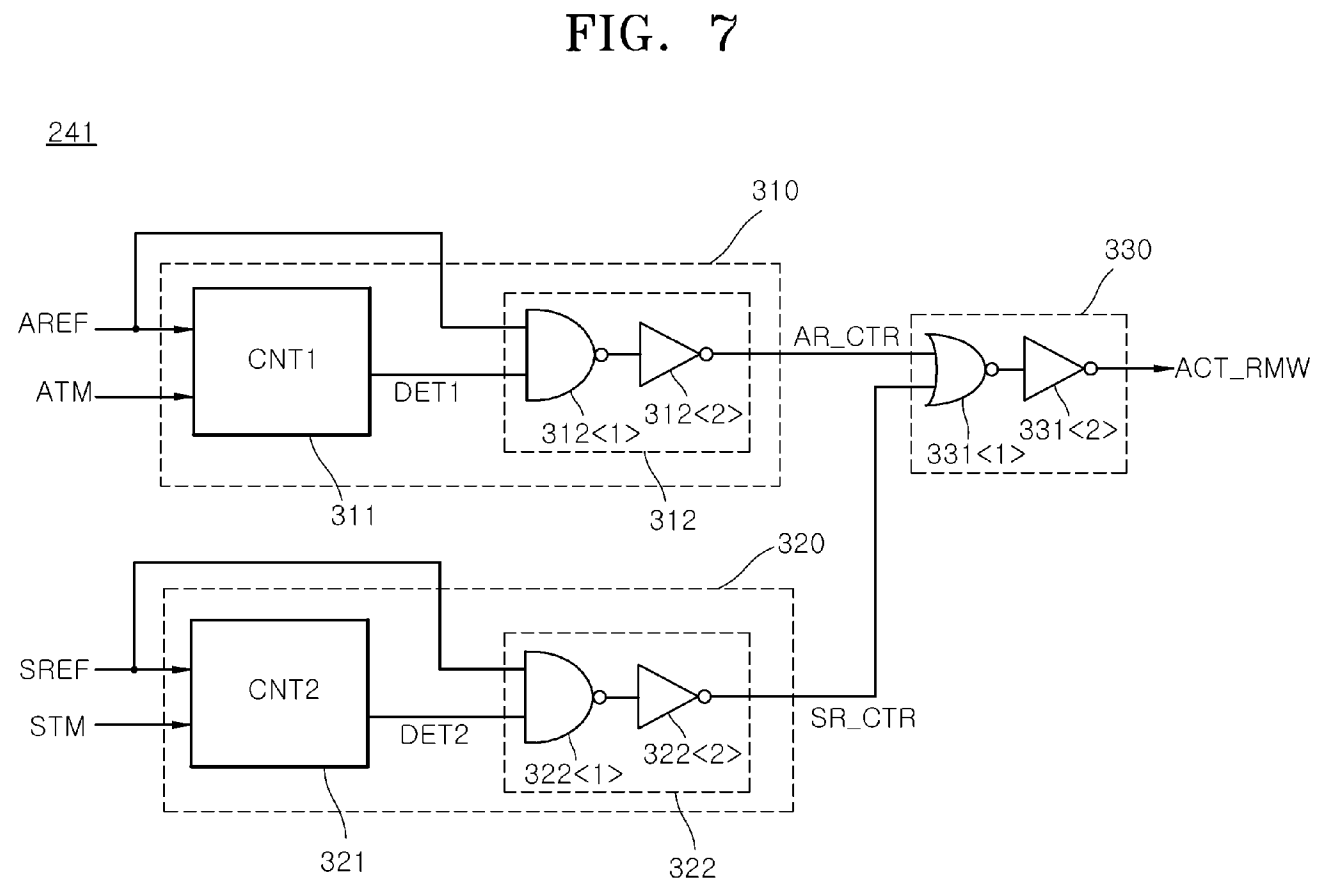

FIG. 7 is a diagram illustrating a construction according to an embodiment of the internal active signal generation circuit 241 that is included in the read-modify-write control circuit 240. The internal active signal generation circuit 241 may include an auto-refresh control signal generation circuit 310, a self-refresh control signal generation circuit 320, and a logic circuit 330.

The auto-refresh control signal generation circuit 310 may include a first counter (CNT1) 311 and an auto-refresh control signal output circuit 312.

The first counter 311 may set the first set number in response to the auto-test mode signal ATM. When the auto-refresh command AREF is input the first set number of times, the first counter 311 may generate a first detection signal DET1 that is enabled to a logic high level. For example, the first counter 311 may set the first set number to five in response to the auto-test mode signal ATM. In this case, when the auto-refresh command AREF is input five times, the first counter 311 may generate the first detection signal DET1 that is enabled to a logic high level.

The auto-refresh control signal output circuit 312 may be implemented by using a NAND gate 312<1> and an inverter 312<2>. When the first detection signal DET1 is disabled to a logic low level, the auto-refresh control signal output circuit 312 may generate an auto-refresh control signal AR_CTR that is disabled to a logic low level. When the first detection signal DET1 is enabled to a logic high level, the auto-refresh control signal output circuit 312 may generate the auto-refresh control signal AR_CTR that is enabled to a logic high level by buffering the auto-refresh command AREF.

The auto-refresh control signal generation circuit 310 may set the first set number in response to the auto-test mode signal ATM. When the auto-refresh command AREF is input the first set number of times, the auto-refresh control signal generation circuit 310 may generate the auto-refresh control signal AR_CTR that is enabled to a logic high level.

The self-refresh control signal generation circuit 320 may include a second counter (CNT2) 321 and a self-refresh control signal output circuit 322.

The second counter 321 may set the second set number in response to the self-test mode signal STM. When the self-refresh command SREF is input the second set number of times, the second counter 321 may generate a second detection signal DET2 that is enabled to a logic high level. For example, the second counter 321 may set the second set number to seven in response to the self-test mode signal STM. In this case, when the self-refresh command SREF is input seven times, the second counter 321 may generate the second detection signal DET2 that is enabled to a logic high level.

The self-refresh control signal output circuit 322 may be implemented by using a NAND gate 322<1> and an inverter 322<2>. When the second detection signal DET2 is disabled to a logic low level, the self-refresh control signal output circuit 322 may generate a self-refresh control signal SR_CTR that is disabled to a logic low level. When the second detection signal DET2 is enabled to a logic high level, the self-refresh control signal output circuit 322 may generate the self-refresh control signal SR_CTR that is enabled to a logic high level by buffering the self-refresh command SREF.

The self-refresh control signal generation circuit 320 may set the second set number in response to the self-test mode signal STM. When the self-refresh command SREF is input the second set number of times, the self-refresh control signal generation circuit 320 may generate the self-refresh control signal SR_CTR that is enabled to a logic high level.

The logic circuit 330 may be implemented by using a NOR gate 331<1> and an inverter 331<2>. The logic circuit 330 may generate the internal active signal ACT_RMW based on the auto-refresh control signal AR_CTR and the self-refresh control signal SR_CTR. When any one of the auto-refresh control signal AR_CTR and the self-refresh control signal SR_CTR is enabled to a logic high level, the logic circuit 330 may generate the internal active signal ACT_RMW that is enabled to a logic high level.

Figure 8:
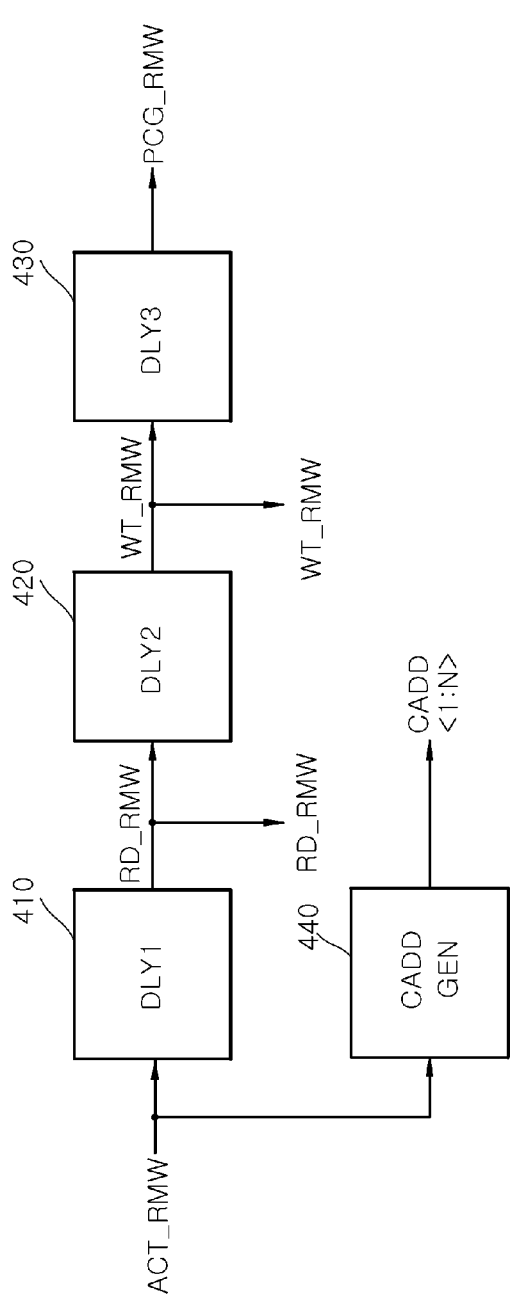
FIG. 8 is a block diagram illustrating a construction according to an embodiment of a read/write control circuit that is included in the read-modify-write control circuit illustrated in FIG. 6.

FIG. 8 is a block diagram illustrating a construction according to an embodiment of the read/write control circuit 242 that is included in the read-modify-write control circuit 240. The read/write control circuit 242 may include a first delay circuit (DLY1) 410, a second delay circuit (DLY2) 420, a third delay circuit (DLY3) 430, and a column address generation circuit (CADD GEN) 440.

The first delay circuit 410 may generate the internal read signal RD_RMW by delaying the internal active signal ACT_RMW. A delay quantity of the first delay circuit 410 may be set as a delay quantity corresponding to the time for which the internal data (ID<1:8> in FIG. 11) are output by the memory circuit 260.

The second delay circuit 420 may generate the internal write signal WT_RMW by delaying the internal read signal RD_RMW. A delay quantity of the second delay circuit 420 may be set as a delay quantity corresponding to the time for which an error of the internal data (ID<1:8> in FIG. 11) is corrected by the column control circuit 280.

The third delay circuit 430 may generate the internal precharge signal PCG_RMW by delaying the internal write signal WT_RMW. A length of delay of the third delay circuit 430 may correspond to the time it takes for the internal data (ID<1:8> in FIG. 11) to be stored in the memory circuit 260.

When the internal active signal ACT_RMW is input, the column address generation circuit 440 may generate the first to N-th column addresses CADD<1:N> that are sequentially counted. The column address generation circuit 440 may generate the first to N-th column addresses CADD<1:N> that are up-counted and down-counted whenever the internal active signal ACT_RMW is input.

Figure 9:
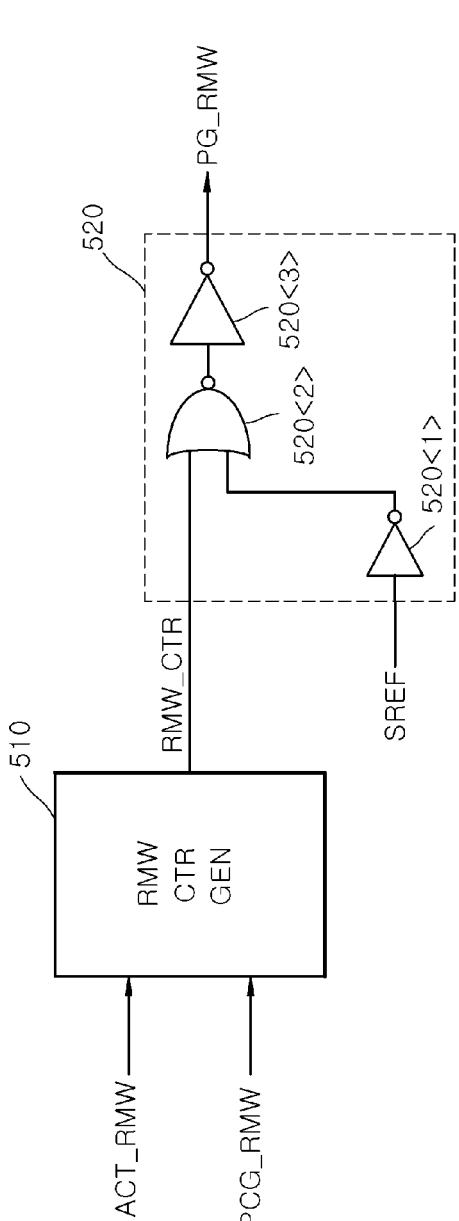
FIG. 9 is a diagram illustrating a construction according to an embodiment of a power control signal generation circuit that is included in the read-modify-write control circuit illustrated in FIG. 6.

FIG. 9 is a diagram illustrating a construction according to an embodiment of the power control signal generation circuit 243 that is included in the read-modify-write control circuit 240. The power control signal generation circuit 243 may include an internal control signal generation circuit 510 (RMW CTR GEN) and a power control signal output circuit 520.

The internal control signal generation circuit 510 may generate the internal control signal RMW_CTR based on the internal active signal ACT_RMW and the internal precharge signal PCG_RMW. When the internal active signal ACT_RMW is enabled to a logic high level, the internal control signal generation circuit 510 may generate the internal control signal RMW_CTR having a logic high level. When the internal precharge signal PCG_RMW is enabled to a logic high level, the internal control signal generation circuit 510 may generate the internal control signal RMW_CTR having a logic low level.

The power control signal output circuit 520 may be implemented by using an inverter 520<1>, a NOR gate 520<2>, and an inverter 520<3>. The power control signal output circuit 520 may generate the power control signal PG_RMW based on the self-refresh command SREF and the internal control signal RMW_CTR. When the internal control signal RMW_CTR is enabled to a logic high level, the power control signal output circuit 520 may generate the power control signal PG_RMW that is enabled to a logic high level. When the internal control signal RMW_CTR is disabled to a logic low level during an interval in which the self-refresh command SREF is enabled to a logic high level, the power control signal output circuit 520 may generate the power control signal PG_RMW that is disabled to a logic low level.

Figure 10:
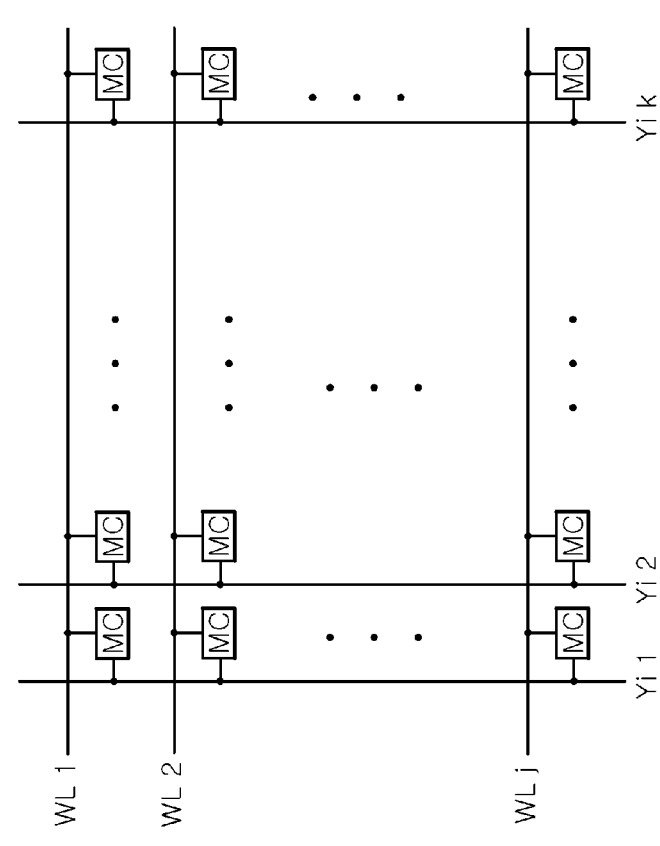
FIG. 10 is a diagram illustrating a construction according to an embodiment of a memory circuit that is included in the semiconductor device illustrated in FIG. 2.

FIG. 10 is a diagram illustrating a construction according to an embodiment of the memory circuit 260 that is included in the semiconductor device 20. The memory circuit 260 may include the multiple word lines WL1 to WLj, the multiple column lines Yi1 to Yik, and the multiple memory cells MC.

The multiple memory cells MC that are included in the memory circuit 260 may be connected to locations at which the multiple word lines WL1 to WLj and the multiple column lines Yi1 to Yik intersect. After the start of an auto-refresh operation, the memory circuit 260 may sequentially activate the multiple word lines WL1 to WLj based on the first to M-th row addresses RADD<1:M>. After the start of a smart refresh operation, the memory circuit 260 may activate word lines adjacent to a word line that is repeatedly activated, among the multiple word lines WL1 to WLj, based on the first to M-th row addresses RADD<1:M> that are generated from the first to M-th target addresses SM_ADD<1:M>. After the start of a self-refresh operation, the memory circuit 260 may sequentially activate the multiple word lines WL1 to WLj based on the first to M-th row addresses RADD<1:M>. After the start of a read-modify-write operation, the memory circuit 260 may output the internal data (ID<1:8> in FIG. 11) that have been stored in a memory cell MC that is connected to a word line that is activated, among the multiple word lines WL1 to WLj, and a column line that is activated, among the multiple column lines Yi1 to Yik. The memory circuit 260 may output the internal parities (IP<1:3> in FIG. 11) including information with regard to an error of the internal data (ID<1:8> in FIG. 11). After the start of a read-modify-write operation, the memory circuit 260 may store the internal data (ID<1:8> in FIG. 11) having a corrected error in a memory cell MC that is connected to a word line that is activated, among the multiple word lines WL1 to WLj, and a column line that is activated, among the multiple column lines Yi1 to Yik.

Figure 11:
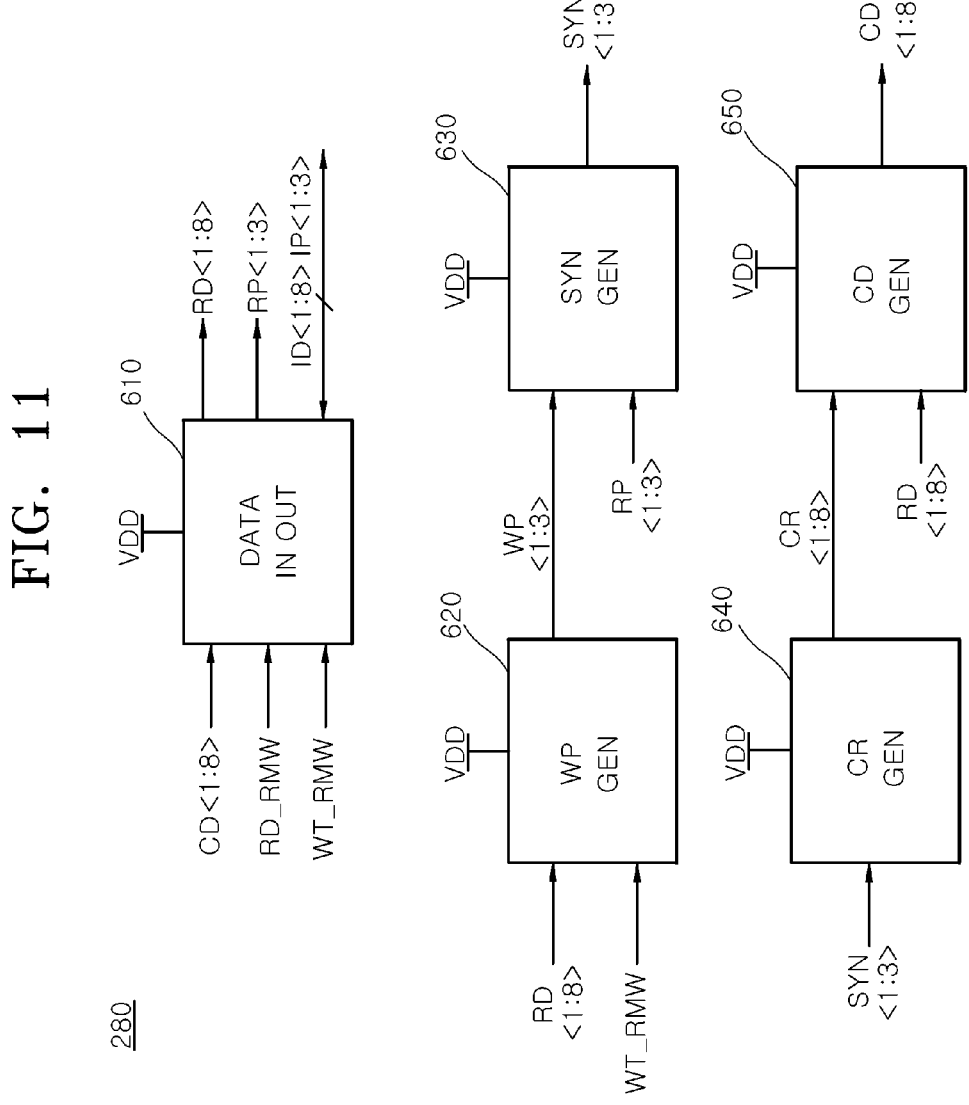
FIG. 11 is a block diagram illustrating a construction according to an embodiment of a column control circuit that is included in the semiconductor device illustrated in FIG. 2.

FIG. 11 is a block diagram illustrating a construction according to an embodiment of the column control circuit 280 that is included in the semiconductor device 20. The column control circuit 280 may include a data input and output circuit (DATA IN OUT) 610, a write parity generation circuit (WP GEN) 620, a syndrome generation circuit (SYN GEN) 630, an error correction signal generation circuit (CR GEN) 640, and a correction data generation circuit (CD GEN) 650.

The data input and output circuit 610 may be driven by being supplied with the power supply voltage VDD. When the internal read signal RD_RMW is input, the data input and output circuit 610 may receive the first to eighth internal data ID<1:8> and the first to third internal parities IP<1:3>. When the internal read signal RD_RMW is input, the data input and output circuit 610 may generate the first to eighth read data RD<1:8> and the first to third read parities PR<1:3> from the first to eighth internal data ID<1:8> and the first to third internal parities IP<1:3>. The data input and output circuit 610 may receive first to eighth correction data CD<1:8> when the internal write signal WT_RMW is input. The data input and output circuit 610 may output the first to eighth correction data CD<1:8> as the first to eighth internal data ID<1:8> when the internal write signal WT_RMW is input.

The write parity generation circuit 620 may be driven by being supplied with the power supply voltage VDD. The write parity generation circuit 620 may receive the first to eighth read data RD<1:8> when the internal write signal WT_RMW is input. The write parity generation circuit 620 may generate the first to third write parities WP<1:3> by performing an error correction code (ECC) encoding operation on the first to eighth read data RD<1:8>. By using an ECC, the write parity generation circuit 620 may generate the first to third write parities WP<1:3> including error information that is included in the first to eighth read data RD<1:8>.

The syndrome generation circuit 630 may be driven by being supplied with the power supply voltage VDD. The syndrome generation circuit 630 may generate first to third syndromes SYN<1:3> by comparing the first to third write parities WP<1:3> and the first to third read parities RP<1:3>.

The error correction signal generation circuit 640 may generate first to eighth error correction signals CR<1:8> by performing an ECC decoding operation on the first to third syndromes SYN<1:3>. By using an ECC, the error correction signal generation circuit 640 may generate the first to eighth error correction signals CR<1:8> for correcting an error that is included in the first to eighth read data RD<1:8> based on the first to third syndromes SYN<1:3>.

Based on the first to eighth error correction signals CR<1:8>, the correction data generation circuit 650 may generate the first to eighth correction data CD<1:8> by correcting an error that is included in the first to eighth read data RD<1:8>. For example, when a first error correction signal CR<1> is enabled, the correction data generation circuit 650 may generate first correction data CD<1> by inverting the logic level of first read data RD<1> and may generate second to eighth correction data CD<2:8> by buffering second to eighth read data RD<2:8>. That is, the correction data generation circuit 650 may generate the first to eighth correction data CD<1:8> by correcting an error of the first read data RD<1>.

Figure 12:
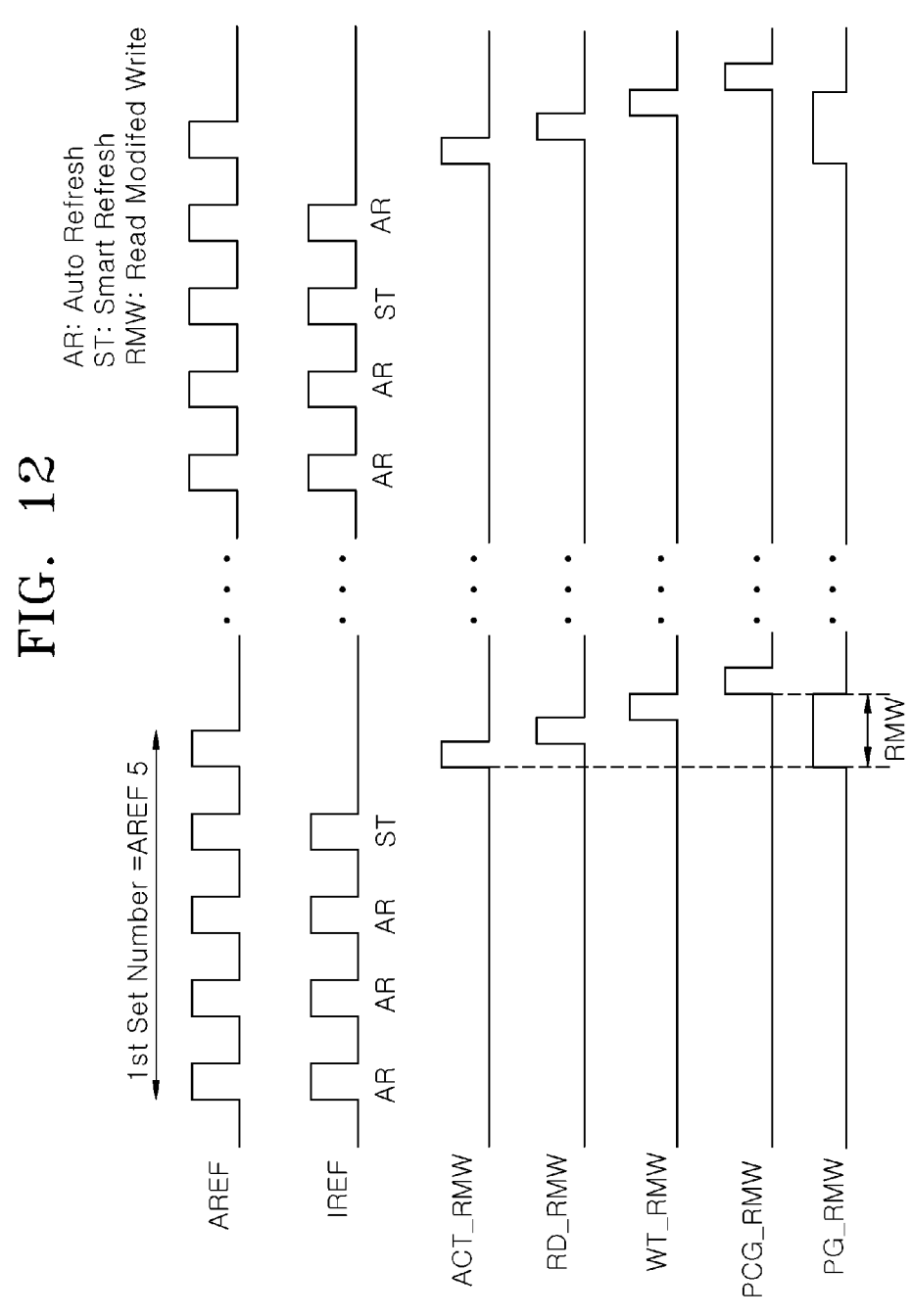
FIG. 12 is a diagram for describing an auto-refresh operation of a semiconductor device according to an embodiment of the present disclosure.

FIG. 12 is a diagram for describing an auto-refresh operation of a semiconductor device according to an embodiment of the present disclosure. A case in which the first set number is set to five (1$^{st}$ set number=AREF 5) for an auto-refresh operation is described as follows with reference to FIG. 12.

The command generation circuit 210 may generate the auto-refresh command AREF five times based on the chip selection signal CS and the first to L-th command addresses CA<1:L> that are input in synchronization with the clock CLK.

When the auto-refresh command AREF is input three times and the refresh enable signal REN is enabled, the row address generation circuit 220 may generate the first to M-th row addresses RADD<1:M> that are sequentially counted.

The refresh control circuit 230 may generate the internal refresh signal IREF three times, the internal refresh signal IREF including a pulse that is generated when the auto-refresh command AREF is input.

The memory circuit 260 may perform an auto-refresh operation AR based on the multiple word lines WL1 to WLj being sequentially activated by the first to M-th row addresses RADD<1:M> after the start of the auto-refresh operation.

When the auto-refresh command AREF is input four times and the refresh enable signal REN is disabled, the row address generation circuit 220 may generate the first to M-th row addresses RADD<1:M> from the first to M-th target addresses SM_ADD<1:M>.

The memory circuit 260 may perform a smart refresh operation ST based on word lines adjacent to a word line that is repeatedly activated, among the multiple word lines WL1 to WLj, being activated by the first to M-th row addresses RADD<1:M> after the start of the auto-refresh operation.

The read-modify-write control circuit 240 may generate the internal active signal ACT_RMW when the auto-refresh command AREF is input five times. When the internal active signal ACT_RMW is input, the read-modify-write control circuit 240 may generate the power control signal PG_RMW that is enabled.

The power supply circuit 270 may supply the power supply voltage VDD to the column control circuit 280 during an interval in which the power control signal PG_RMW is enabled to a logic high level.

The read-modify-write control circuit 240 may generate the internal read signal RD_RMW by delaying the internal active signal ACT_RMW.

The column control circuit 280 may receive the first to eighth internal data ID<1:8> and the first to third internal parities IP<1:3> from the memory circuit 260 when the internal read signal RD_RMW is input. When the internal read signal RD_RMW is input, the column control circuit 280 may generate the first to eighth read data RD<1:8> and the first to third read parities RP<1:3> from the first to eighth internal data ID<1:8> and the first to third internal parities IP<1:3>.

The read-modify-write control circuit 240 may generate the internal write signal WT_RMW by delaying the internal read signal RD_RMW.

When the internal write signal WT_RMW is input, the column control circuit 280 may generate the first to eighth internal data ID<1:8> by correcting an error of the first to eighth read data RD<1:8> based on the first to third write parities WP<1:3> and the first to third read parities RP<1:3> that are generated from the first to eighth read data RD<1: 8>.

The memory circuit 260 may perform a read-modify-write operation RMW of storing the first to eighth internal data ID<1:8> in a memory cell MC that is connected to a word line that is activated by the first to M-th row addresses RADD<1:M>, among the multiple word lines WL1 to WLj, and a column line that is activated by the first to N-th column addresses CADD<1:N>, among the multiple column lines Yi1 to Yik.

The read-modify-write control circuit 240 may generate the internal precharge signal PCG_RMW by delaying the internal write signal WT_RMW.

When the internal precharge signal PCG_RMW is input, the read-modify-write control circuit 240 may generate the power control signal PG_RMW that is disabled.

The power supply circuit 270 may block the supply of the power supply voltage VDD when the power control signal PG_RMW is disabled to a logic low level.

As described above, the semiconductor system 1 can prevent the occurrence of an error of the internal data ID<1:8> as word lines adjacent to a word line that corresponds to a target address for selecting the word line and that is repeatedly activated are activated by performing a smart refresh operation of an auto-refresh operation. The semiconductor system 1 can perform an efficient operation without the need to add a command for performing a read-modify-write operation because an error of the internal data ID<1:8> is corrected by performing the read-modify-write operation when an auto-refresh operation is performed a set number of times. The semiconductor system 1 can prevent an error of the internal data ID<1:8> by correcting an error of the internal data ID<1:8> by performing a read-modify-write operation when an auto-refresh operation is performed a set number of times. The semiconductor system 1 can reduce the power consumption by supplying the power supply voltage VDD to the column control circuit 280 only during an interval in which a read-modify-write operation is performed when an auto-refresh operation is performed a set number of times.

Figure 13:
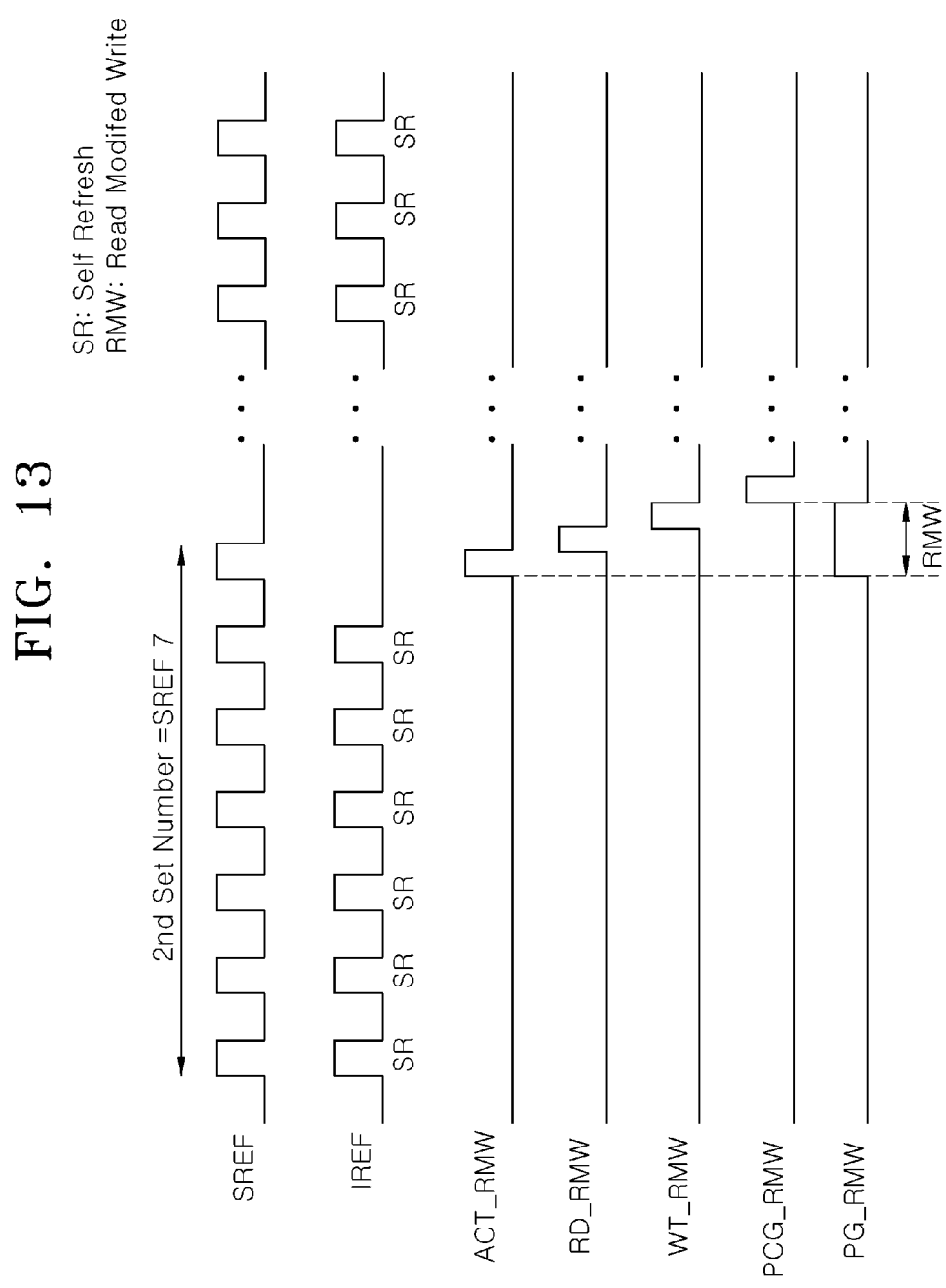
FIG. 13 is a diagram for describing a self-refresh operation of a semiconductor device according to an embodiment of the present disclosure.

FIG. 13 is a diagram for describing a self-refresh operation of a semiconductor device according to an embodiment of the present disclosure. A case in which the second set number is set to seven ($2^{nd}$ set number=SREF 7) for a self-refresh operation is described as follows with reference to FIG. 13.

The command generation circuit 210 may generate the self-refresh command SREF seven times based on the chip selection signal CS and the first to L-th command addresses CA<1:L> that are input in synchronization with the clock CLK.

When the self-refresh command SREF is input seven times and the refresh enable signal REN is enabled, the row address generation circuit 220 may generate the first to M-th row addresses RADD<1:M> that are sequentially counted.

The refresh control circuit 230 may generate the internal refresh signal IREF six times, the internal refresh signal IREF including a pulse that is periodically generated when the self-refresh command SREF is input.

The memory circuit 260 may perform a self-refresh operation SR based on the multiple word lines WL1 to WLj being sequentially activated by the first to M-th row addresses RADD<1:M> after the start of a self-refresh operation.

The read-modify-write control circuit 240 may generate the internal active signal ACT_RMW when the self-refresh command SREF is input seven times. When the internal active signal ACT_RMW is input, the read-modify-write control circuit 240 may generate the power control signal PG_RMW that is enabled.

The power supply circuit 270 may supply the power supply voltage VDD to the column control circuit 280 during an interval in which the power control signal PG_RMW is enabled to a logic high level.

The read-modify-write control circuit 240 may generate the internal read signal RD_RMW by delaying the internal active signal ACT_RMW.

When the internal read signal RD_RMW is input, the column control circuit 280 may receive the first to eighth internal data ID<1:8> and the first to third internal parities IP<1:3> from the memory circuit 260. When the internal read signal RD_RMW is input, the column control circuit 280 may generate the first to eighth read data RD<1:8> and the first to third read parities RP<1:3> from the first to eighth internal data ID<1:8> and the first to third internal parities IP<1:3>.

The read-modify-write control circuit 240 may generate the internal write signal WT_RMW by delaying the internal read signal RD_RMW.

When the internal write signal WT_RMW is input, the column control circuit 280 may generate the first to eighth internal data ID<1:8> by correcting an error of the first to eighth read data RD<1:8> based on the first to third write parities WP<1:3> and the first to third read parities RP<1:3> that are generated from the first to eighth read data RD<1: 8>.

The memory circuit 260 may perform a read-modify-write operation RMW of storing the first to eighth internal data ID<1:8> in a memory cell MC that is connected to a word line that is activated by the first to M-th row addresses RADD<1:M>, among the multiple word lines WL1 to WLj, and a column line that is activated by the first to N-th column addresses CADD<1:N>, among the multiple column lines Yi1 to Yik.

The read-modify-write control circuit 240 may generate the internal precharge signal PCG_RMW by delaying the internal write signal WT_RMW.

The read-modify-write control circuit 240 may generate the power control signal PG_RMW that is disabled when the internal precharge signal PCG_RMW is input.

The power supply circuit 270 may block the supply of the power supply voltage VDD when the power control signal PG_RMW is disabled to a logic low level.

As described above, the semiconductor system 1 according to an embodiment of the present disclosure can perform an efficient operation without the need to add a command for performing a read-modify-write operation because an error of the internal data ID<1:8> is corrected by performing the read-modify-write operation when a self-refresh operation is performed a set number of times. The semiconductor system 1 can prevent an error of the internal data ID<1:8> by correcting an error of the internal data ID<1:8> by performing a read-modify-write operation when a self-refresh operation is performed a set number of times. The semiconductor system 1 can reduce power consumption by supplying the power supply voltage VDD to the column control circuit 280 only during an interval in which a read-modify-write operation is performed when a self-refresh operation is performed a set number of times.

Figure 14:
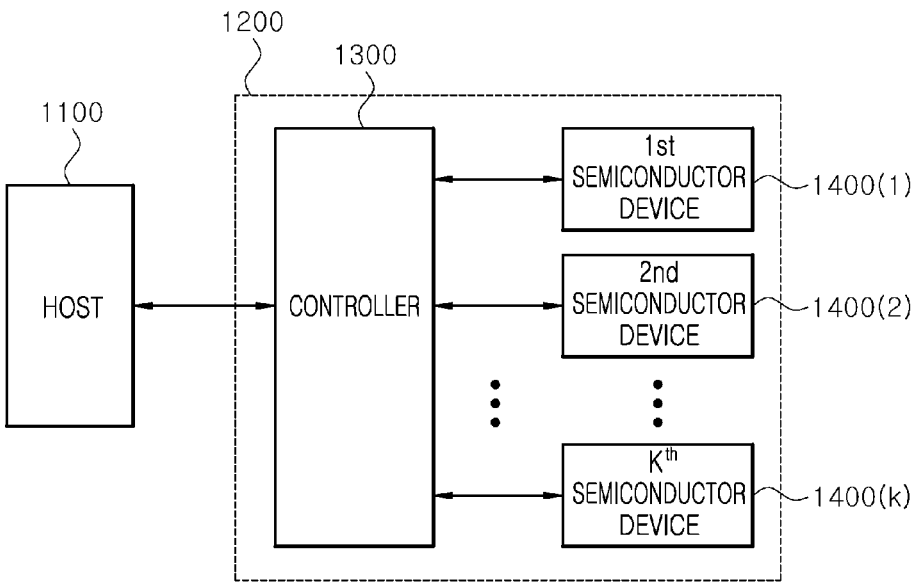
FIG. 14 is a diagram illustrating a construction according to an embodiment of an electronic system to which the semiconductor system illustrated in FIGS. 1 and 13 has been applied.

FIG. 14 is a block diagram illustrating a construction according to an embodiment of an electronic system 1000 according to an embodiment of the present disclosure. As illustrated in FIG. 14, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect—express (PCI-E), advanced technology attachment (ATA), serial ATA (SATA), parallel ATA (PATA), a serial attached SCSI (SAS), a universal serial bus (USB).

The semiconductor system 1200 may include a controller 1300 and semiconductor devices 1400(K:1). The controller 1300 may control the semiconductor devices 1400(K:1) so that the semiconductor devices 1400(K:1) perform an active operation, an auto-refresh operation, and a self-refresh operation. Each of the semiconductor devices 1400(K:1) can prevent the occurrence of an error of the internal data ID<1:8> as word lines adjacent to a word line that corresponds to a target address for selecting the word line and that is repeatedly activated are activated by performing a smart refresh operation of an auto-refresh operation. Each of the semiconductor devices 1400(K:1) can perform an efficient operation without the need to add a command for performing a read-modify-write operation because an error of the internal data ID<1:8> is corrected by performing the read-modify-write operation when each of an auto-refresh operation and a self-refresh operation is performed a set number of times. Each of the semiconductor devices 1400(K:1) can prevent an error of the internal data ID<1:8> by correcting the error of the internal data ID<1:8> by performing a read-modify-write operation when each of an auto-refresh operation and a self-refresh operation is performed a set number of times. Each of the semiconductor devices 1400 (K:1) can reduce power consumption by supplying the power supply voltage VDD to the column control circuit 280 only during an interval in which a read-modify-write operation is performed when each of an auto-refresh operation and a self-refresh operation is performed a set number of times.

The controller 1300 may be implemented as the controller 10 illustrated in FIG. 1. Each of the semiconductor devices 1400(K:1) may be implemented as the semiconductor device 20, illustrated in FIGS. 1 and 2. Each of the semiconductor devices 1400(K:1) according to an embodiment may be implemented as one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor system comprising:

a controller configured to output a clock, a chip selection signal, and a command address and configured to output data; and a semiconductor device configured to perform an auto-refresh operation when the chip selection signal and the command address that are input in synchronization with the clock have a combination for performing the auto-refresh operation, configured to correct an error of internal data that are stored within the semiconductor device by performing a read-modify-write operation instead of the auto-refresh operation when the auto-refresh operation is performed a first set number of times and to store the corrected internal data, configured to perform a self-refresh operation when the chip selection signal and the command address that are input in synchronization with the clock have a combination for performing the self-refresh operation, and configured to correct an error of the internal data that are stored within the semiconductor device by performing a read-modify-write operation instead of the self-refresh operation when the self-refresh operation is performed a second set number of times and to store the corrected internal data, wherein the semiconductor device is configured to perform an operation of activating word lines adjacent to a word line corresponding to a target address by performing a smart refresh operation of the auto-refresh operation.

2. The semiconductor system of claim 1, wherein the semiconductor device comprises:

a command generation circuit configured to generate an auto-refresh command, a self-refresh command, an active command, and an internal command address based on the chip selection signal and the command address that are input in synchronization with the clock;

a row control circuit configured to activate multiple word lines based on row addresses that are sequentially counted when an internal refresh signal that is generated based on the auto-refresh command and the self-refresh command is input;

a read-modify-write control circuit configured to set the first set number and the second set number in response to an auto-test mode signal and a self-test mode signal, configured to generate a power control signal when the auto-refresh command and the self-refresh command are input, configured to generate an internal active signal, an internal read signal, an internal write signal, and an internal precharge signal that are sequentially enabled, and configured to generate column addresses that are sequentially counted;

a power supply circuit configured to supply a power supply voltage to a column control circuit during an interval in which the power control signal is enabled; and the column control circuit configured to operate by being supplied with the power supply voltage, configured to generate read data and a read parity when the internal read signal is input, and configured to output the read data as internal data by correcting an error of the read data based on the read parity and a write parity when the internal write signal is input.

3. The semiconductor system of claim 2, wherein the row control circuit is configured to activate the multiple word lines based on the row address when the internal active signal and the internal refresh signal are input.

4. The semiconductor system of claim 2, wherein the power supply circuit comprises a switch that is turned on during the interval in which the power control signal is enabled and configured to supply the power supply voltage to the column control circuit.

5. The semiconductor system of claim 2, wherein the read-modify-write control circuit comprises:

an internal active signal generation circuit configured to set the first set number and the second set number in response to the auto-test mode signal and the self-test mode signal and configured to generate the internal active signal when the auto-refresh command is input the first set number of times or the self-refresh command is input the second set number of times;

a read/write control circuit configured to generate the internal read signal, the internal write signal, and the internal precharge signal that are sequentially enabled by delaying the internal active signal and configured to generate the column addresses that are sequentially counted; and a power control signal generation circuit configured to generate the power control signal that is enabled when the internal active signal is input and that is disabled when the internal precharge signal is input during an interval in which the self-refresh command is enabled.

6. The semiconductor system of claim 5, wherein the internal active signal generation circuit comprises:

an auto-refresh control signal generation circuit configured to set the first set number in response to the auto-test mode signal and configured to generate an auto-refresh control signal when the auto-refresh command is input the first set number of times;

a self-refresh control signal generation circuit configured to set the second set number in response to the self-test mode signal and configured to generate a self-refresh control signal when the self-refresh command is input the second set number of times; and a logic circuit configured to generate the internal active signal from any one of the auto-refresh control signal and the self-refresh control signal.

7. The semiconductor system of claim 5, wherein the read/write control circuit comprises:

a first delay circuit configured to generate the internal read signal by delaying the internal active signal;

a second delay circuit configured to generate the internal write signal by delaying the internal read signal;

a third delay circuit configured to generate the internal precharge signal by delaying the internal write signal; and a column address generation circuit configured to generate the column addresses that are sequentially counted when the internal active signal is input.

8. The semiconductor system of claim 5, wherein the power control signal generation circuit comprises:

an internal control signal generation circuit configured to generate an internal control signal that is enabled when the internal active signal is input and that is disabled when the internal precharge signal is input; and a power control signal output circuit configured to generate the power control signal by buffering the internal control signal during the interval in which the self-refresh command is enabled.

9. The semiconductor system of claim 2, wherein the column control circuit is configured to:

generate the read data and the read parity by receiving internal data and an internal parity that are output by a memory circuit based on the column address when the internal read signal is input, generate the internal data by correcting an error of the read data based on the read parity and the write parity when the internal write signal is input, and output the internal data to the memory circuit based on the column address.

10. The semiconductor system of claim 2, wherein the column control circuit comprises:

a data input and output circuit driven by being supplied with the power supply voltage, configured to generate the read data and the read parity by receiving internal data and an internal parity when the internal read signal is input, configured to receive correction data when the internal write signal is input, and configured to output the correction data as the internal data;

a write parity generation circuit driven by being supplied with the power supply voltage, configured to receive the read data when the internal write signal is input, and configured to generate the write parity by performing an error correction code (ECC) encoding operation on the read data;

a syndrome generation circuit driven by being supplied with the power supply voltage and configured to generate a syndrome by comparing the write parity and the read parity;

an error correction signal generation circuit configured to generate an error correction signal by performing an ECC decoding operation on the syndrome; and a correction data generation circuit configured to generate the correction data by correcting an error that is included in the read data in response to the error correction signal.

* * * * *